United States Patent
Lin et al.

(10) Patent No.: US 7,733,978 B2
(45) Date of Patent: Jun. 8, 2010

(54) APPARATUS AND METHOD OF DYNAMICALLY ADAPTING THE LUT SPACING FOR LINEARIZING A POWER AMPLIFIER

(75) Inventors: Chih-Hung Lin, Tai-Nan Hsien (TW); Jiunn-Tsair Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 907 days.

(21) Appl. No.: 11/420,482

(22) Filed: May 26, 2006

(65) Prior Publication Data

US 2007/0273439 A1    Nov. 29, 2007

(51) Int. Cl.
    *H04K 1/02* (2006.01)
(52) U.S. Cl. ............... 375/297; 375/296; 375/346; 375/348; 375/232; 375/254
(58) Field of Classification Search .......... 375/297, 375/296, 346, 348, 232, 254
    See application file for complete search history.

(56) References Cited

U.S. PATENT DOCUMENTS

| | | | | |
|---|---|---|---|---|
| 5,049,832 | A | 9/1991 | Cavers | 330/149 |
| 2003/0184374 | A1* | 10/2003 | Huang et al. | 330/149 |
| 2005/0017801 | A1* | 1/2005 | Bachman et al. | 330/149 |
| 2005/0140438 | A1 | 6/2005 | Jin et al. | 330/149 |

FOREIGN PATENT DOCUMENTS

TW    200428763    12/2004

OTHER PUBLICATIONS

J. K. Cavers, Amplifier linearization using a digital predistorter with fast adaptation and low memory requirements,.IEEE Trans. On Veh. Technol., vol. 39, pp. 374-382, Nov. 1990.
L. Sundstrom, M. Faulkner, and M. Johansson, Quantization analysis and design of a digital predistortion linearizer for RF power amplifiers,. IEEE Trans. on Veh. Technol., vol. 45, pp. 707-719, Nov. 1996.
A. S. Wright and W. G. Durtler, Experimental performance of an adaptive digital linearized power amplifier ,.IEEE Trans. on Veh. Technol., vol. 41, pp. 395-400, Nov. 1992.
J. K. Cavers, Optimum table spacing in predistorting amplifier linearizers,. IEEE Trans. On Veh. Technol., vol. 48, pp. 1699-1705, Sep. 1999.
J.Y. Hassani and M. Kamarei, A Flexible method of LUT indexing in digital pre-distortion linearization of RF power amplifiers,. IEEE International Symposium on Circuits and Syst., vol. 1, pp. 53-56, May 2001.

* cited by examiner

*Primary Examiner*—Shuwang Liu
*Assistant Examiner*—Kabir A Timory

(57) ABSTRACT

A digital adaptive predistorter look up table (DAPD-LUT) technique dynamically adapts a look up table (LUT) an LUT spacing for linearizing a power amplifier (PA). It optimizes the LUT spacing for the PA without prior knowledge of system state information. A size-N LUT divides a whole unsaturated PA input amplitude range into N bins, each predistorted by an entry of the LUT. The LUT is indexed by an input amplitude of a modulated signal via an index mapper to implement an unconditionally non-uniform LUT spacing. A spacing adaptor online interactively adapts the LUT spacing. The adapted LUT spacing balances the inter-modulation distortion (IMD) power at the PA output corresponding to each bin, so that the total IMD power at the PA output is minimized. This dynamically-optimum technique is practical, robust, and with low complexity.

15 Claims, 10 Drawing Sheets

APPARATUS AND METHOD OF DYNAMICALLY ADAPTING THE LUT SPACING FOR LINEARIZING A POWER AMPLIFIER

FIELD OF THE INVENTION

The present invention generally relates to amplifier linearization, and more specifically to an apparatus and a method of dynamically adapting a look up table (LUT) spacing for linearizing a power amplifier (PA).

BACKGROUND OF THE INVENTION

Power efficiency of a power amplifier is a crucial issue in wireless communication systems. A stand-alone class-A PA suffers the problem of low power efficiency. On the other hand, a stand-alone power efficient PA, like class-AB or class-B amplifier, is usually highly nonlinear. When a non-constant-envelope modulated signal goes through a nonlinear PA, inter-modulation distortion (IMD) will emerges. This not only distorts the modulated signal but also causes the power spectrum of the modulated signal to overflow to the adjacent channels. As a result, both self-interference and mutual-interference among neighboring channels seriously degrade the communication quality. In order to maintain power efficiency and suppress IMD, it is a common practice to adopt a nonlinear PA with high power efficiency.

There exist a few schemes for PA linearization, such as the feed-forward scheme, the feedback scheme, and the predistortion scheme. Each is with either analog approaches or digital approaches. Generally speaking, the feed-forward schemes are costly and the feedback schemes are limited to only narrow band applications. All the analog approaches are inflexible. Therefore, in terms of cost effectiveness, the digital predistortion schemes are superior to the others.

Shown in FIG. 1 is a block diagram illustrating the linearization of a digital predistorter (PD). The digital PD 101 predistorts a modulated input signal $v_m$ to invert the nonlinear distortion introduced by a PA 107. In particular, a digital adaptive PD (DAPD) employing a gain-based look up table 101a is very attractive for its flexibility in algorithm adaptation and its high accuracy in nonlinear compensation. As shown in FIG. 1, the complex baseband modulated input signal $v_m$ carrying the payload data is fed to the cascade of the PD 101 and a radio frequency (RF) link. The PD 101 distorts the modulated input signal $v_m$ to produce a predistorted signal $v_d$. The RF link takes over the predistorted signal $v_d$, to generate the transmission signal $v_a$, through a digital-to-analog (D/A) converter 103 for transformation, a quadature modulator 105 for frequency up-conversion, and the PA 107 for power amplification.

Because the characteristics of a PA may vary with temperature and may be affected by aging, an adaptive algorithm is required in a DAPD-LUT scheme to update the LUT entry values. In addition, the linearization accuracy of a DAPD-LUT scheme in terms of IMD will improve 6 dB if one doubles the number of LUT entries. However, the more LUT entries one adopts, the lower LUT convergence speed it will suffer.

Several gain-based LUT techniques are either analyzed or implemented. FIG. 2 is a block diagram illustrating a conventional gain-based DAPD-LUT technique that the indexing of the N-size LUT entries is uniformly spaced, wherein the normalized unsaturated input amplitude range of a PA is [0, 1] and an LUT entry's spacing $d_i$ equals to 1/N. However, in the uplink or downlink of a wireless network, most transmitted signals do not occupy the input amplitude range of the entire PA. Some LUT entries will never be selected. Therefore, a non-uniform LUT spacing technique is highly desired to avoid wasting LUT entries.

FIG. 3 is a block diagram illustrating a conventional gain-based DAPD-LUT technique with an optimum non-uniform LUT spacing, wherein the LUT is indexed by the input amplitude $r_m$ of input modulated signal via a mapper $S(r_m)$ to implement a non-uniform LUT spacing $d_i$, which is referred to as the conditionally-optimum spacing technique. The technique assumes knowledge of the conditions on the input signal backoff (IBO), the PA characteristics, and the probability density function (PDF) of the modulated input signal. When any of the assumed knowledge varies with time, the optimum LUT spacing needs to be recalculated. Unfortunately, the computational complexity of recalculating the LUT spacing in such a conditionally optimum technique is pretty high.

Since the conditionally optimum technique is optimum only under a specific set of conditions, any condition mismatch could cause significant performance degradation. However, some of conditions are difficult to accurately obtain, e.g. the PA characteristics, and some of conditions can be fast time-varying, e.g. the IBO. In addition, the computational complexity of the conditionally optimum technique thwarts any attempt to online optimize the LUT spacing for a different set of conditions. Therefore, an unconditionally optimized technique is practically useful.

FIG. 4 is another conventional gain-based DAPD-LUT technique with a non-uniform LUT spacing, which is referred to as the piecewise-uniform spacing technique. In the piecewise uniform spacing technique, the whole unsaturated PA input amplitude range is first artificially divided into several segments, such as 4 segments S1-S4, according to the non-linearity of the PA characteristic curve. Each of those nonlinear segments will be assigned more LUT entries than each of those linear segments to combat the PA nonlinear distortion. Although it is still uniform spacing within each segment, this technique as a whole enjoys the advantage of non-uniform LUT spacing. The piecewise-uniform spacing technique also requires prior knowledge of the PA characteristic so as to divide the PA input amplitude range into segments of different linearities. The piecewise-uniform spacing technique focuses on the subject of PA characteristics and ignores how input signal statistics may influence the IMD performance of a PA linearization technique.

Because of the aforementioned problems, it is imperative to provide a technique to dynamically calculate an unconditionally-optimum LUT spacing which minimizes the overall average IMD power.

SUMMARY OF THE INVENTION

The present invention has been made to overcome the aforementioned drawback of conventional gain-based DAPD-LUT techniques for PA linearization. The primary object of the present invention is to provide an apparatus and a method of dynamically adapting the LUT spacing for linearizing a PA. Wherein the LUT spacing is decreased for the amplitude ranges with higher signal probability densities so that the overall average of IMD power is minimized.

The present invention is to provide an apparatus and a method to optimize the LUT spacing for PAs without prior knowledge of system state information (SSI), i.e. an SSI-learning low-complexity technique to optimize the LUT spacing for a DAPD-LUT technique.

The present invention is to provide an apparatus and a method capable of online adapting the LUT spacing for PAs with various nonlinear characteristics, for input signals with various statistics, and for wireless environments with various time-varying properties.

The present invention of an apparatus of dynamically adapting the LUT spacing for linearizing a PA includes an index mapper, a spacing adaptor, and a size-N LUT dividing a whole unsaturated PA input amplitude range into N bins. The apparatus linearizes the PA to produce an amplified output signal in response to a predistorted input derived from an input modulated signal.

According to the present invention, the IMD power associated with each LUT entry is in terms of variables other than the IBO, the PA characteristics and the PDF of the modulated input signal. The concerned LUT spacing problem becomes an optimization problem to minimize the total IMD power at the PA output. The existence of an optimum solution to the optimization problem is also guaranteed. The new LUT spacing balances the IMD power at the PA output corresponding to each bin, so that the total IMD power at the PA output is minimized.

The present invention describes an iterative procedure to approach a stationary solution which is likely to be the optimum solution. After that, it adaptively updates the index mapper through the iterative procedure.

Experimental results demonstrate the feasibility and robustness of the present invention with its performance close to that of the unconditionally-optimum technique and with its computational complexity much lower than that of the conditionally-optimum spacing technique.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENTS

Figure 1:
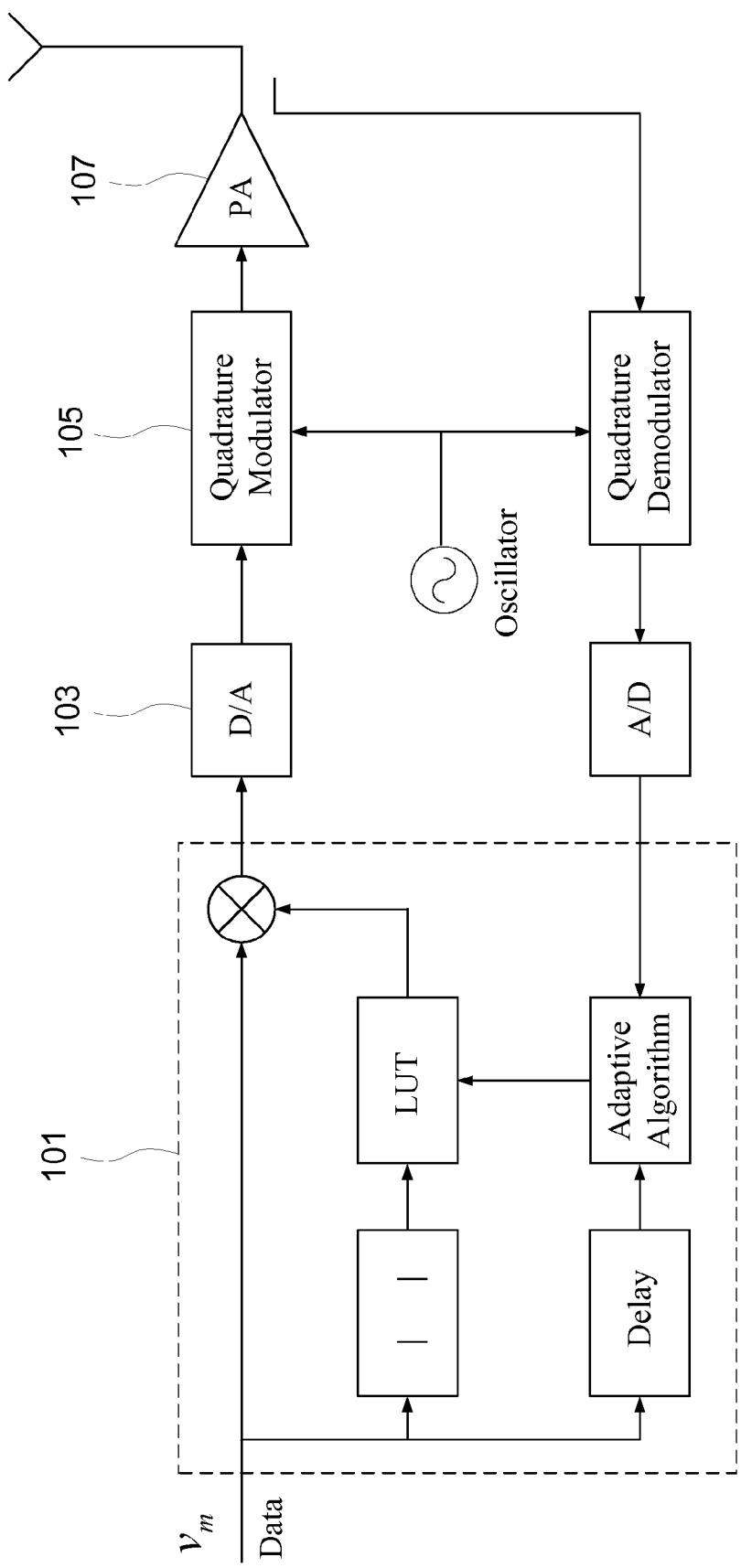
FIG. 1 is a block diagram illustrating the linearization of a digital predistorter.
Figure 2:
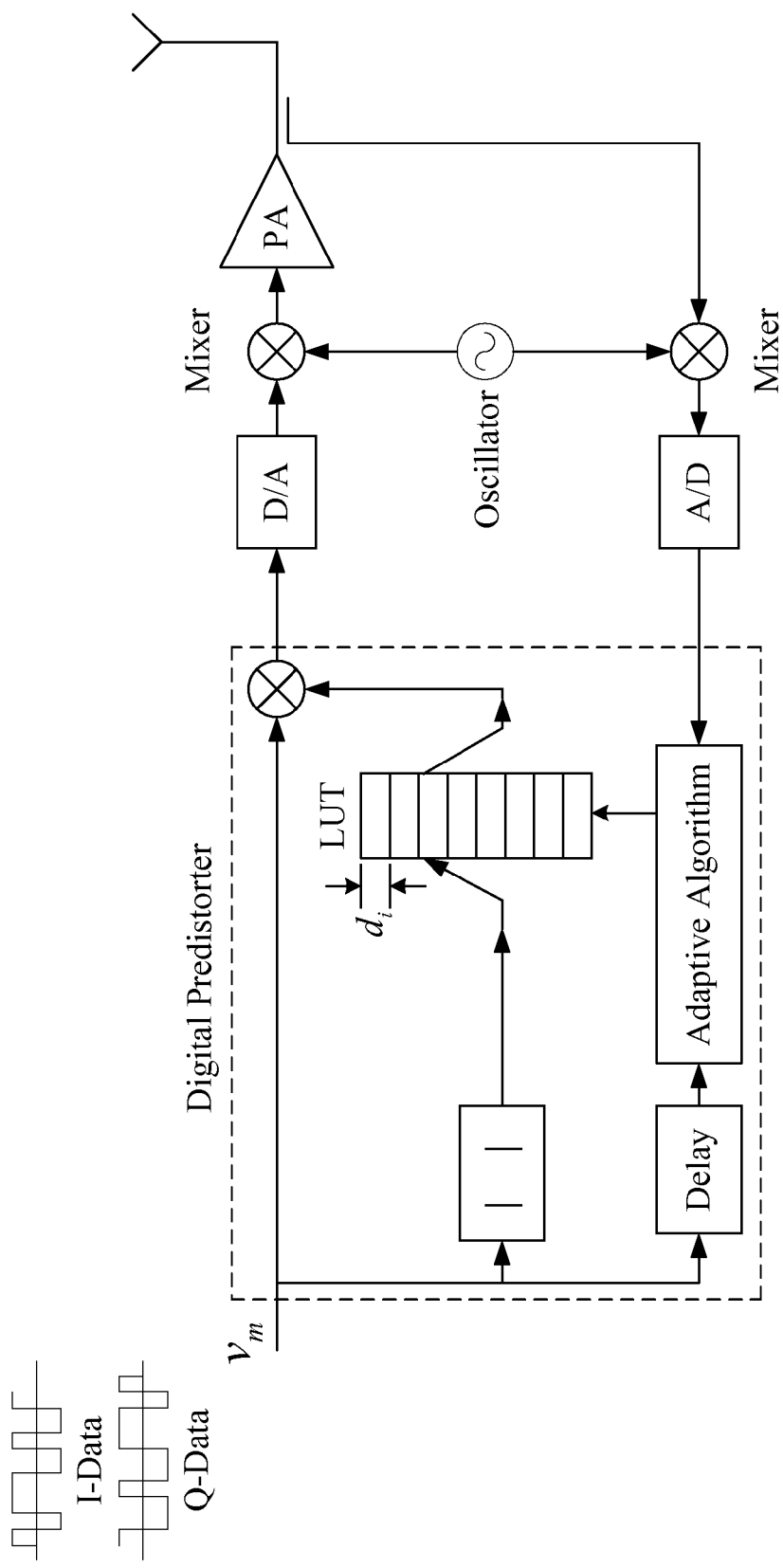
FIG. 2 is a block diagram illustrating a conventional DAPD-LUT technique with a uniform LUT spacing.
Figure 3:
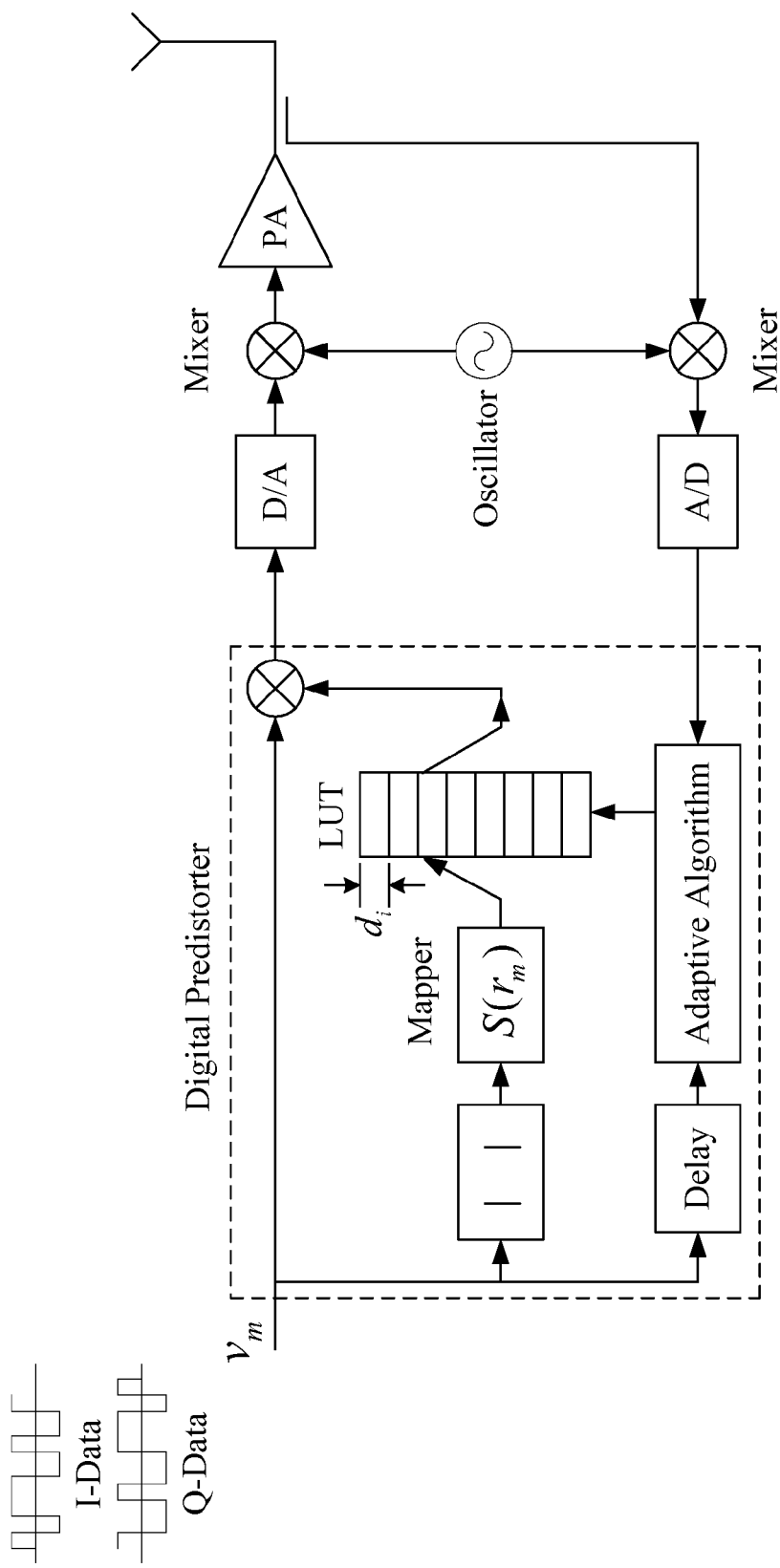
FIG. 3 is a block diagram illustrating a conventional gain-based DAPD-LUT technique with an optimum non-uniform LUT spacing referred to as the conditionally-optimum spacing.
Figure 4:
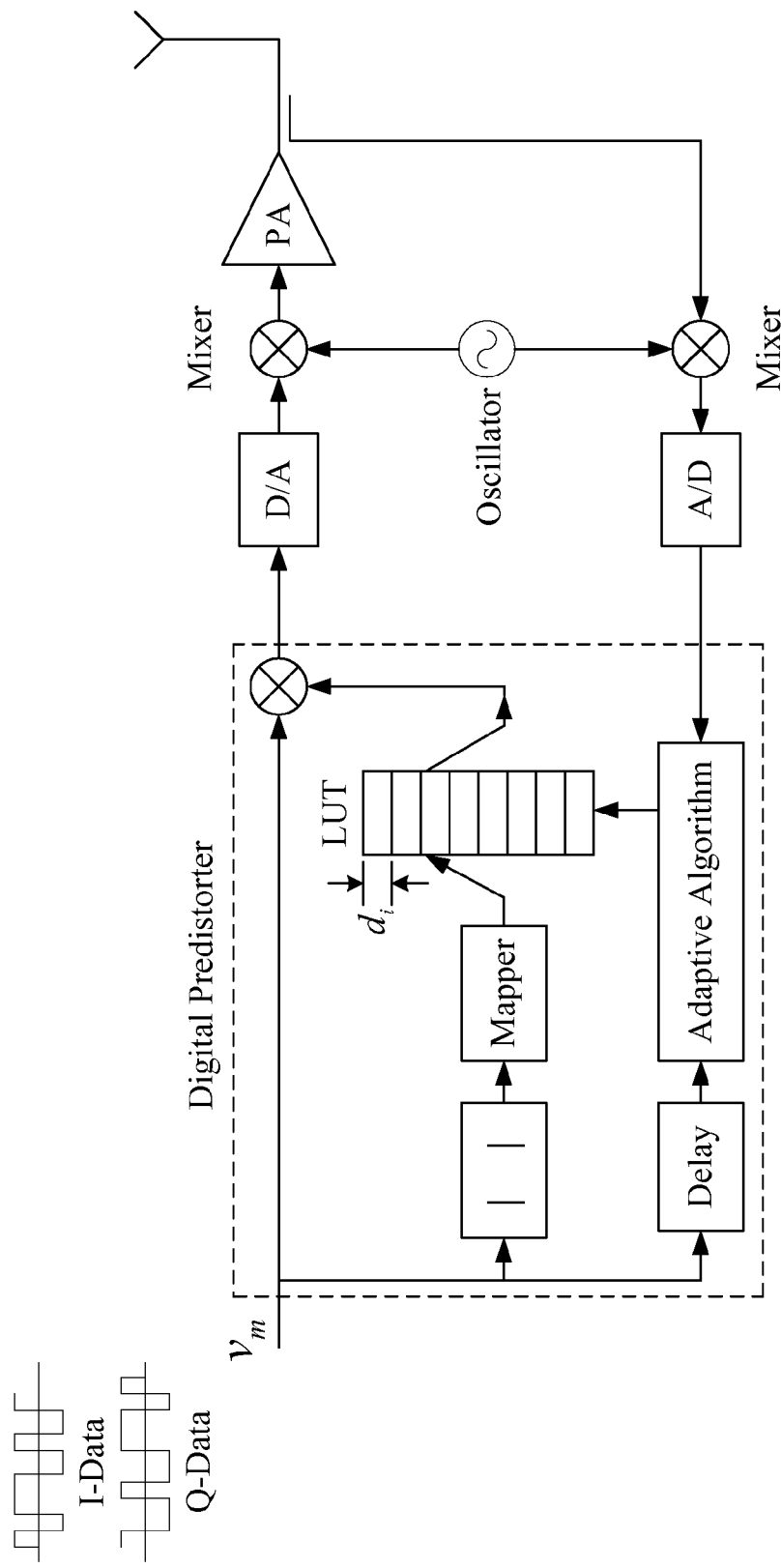
FIG. 4 is another conventional gain-based DAPD-LUT technique with a non-uniform LUT spacing referred to as the piecewise-uniform spacing.
Figure 5:
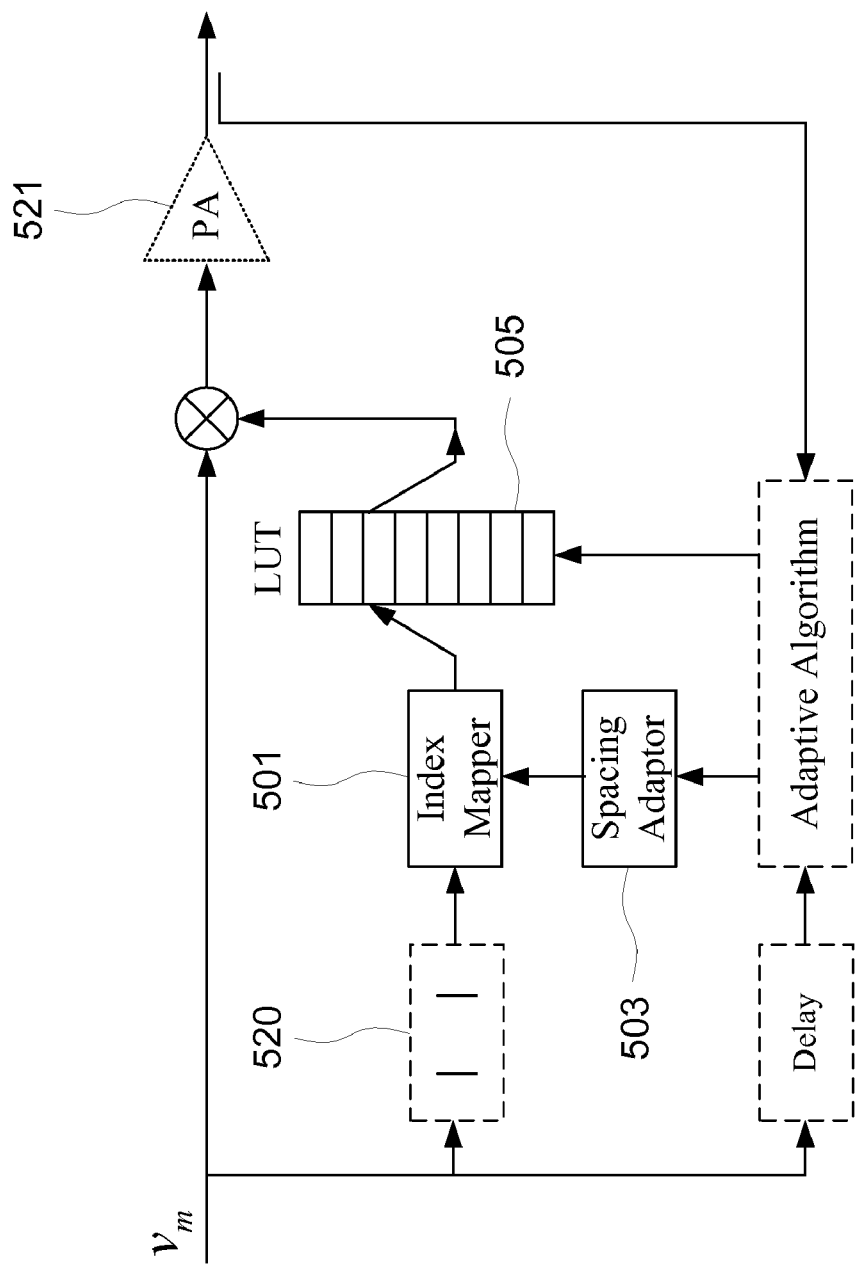
FIG. 5 shows a baseband-equivalent schematic view of a first embodiment of the apparatus according to the present invention.

Without prior knowledge of the system state information (SSI), the present invention provides an apparatus of SSI-learning and low complexity to optimize the LUT spacing for PAs. FIG. 5 shows a baseband-equivalent schematic view of the apparatus according to the present invention. Referring to FIG. 5, the apparatus comprises an index mapper 501, a spacing adaptor 503, and a size-N LUT 505 containing N entries. The apparatus linearizes a PA 521 to produce an amplified output signal in response to a predistorted input derived from an input modulated signal $v_m$.

An amplitude unit 520 derives the absolute amplitude of the input modulated signal $v_m$. The size-N LUT 505 divides the unsaturated PA input amplitude range into N bins, each predistorted by an entry of the LUT 505. The LUT 505 is indexed by an input amplitude $r_m$ of modulated signal via the index mapper 501 to implement an unconditionally non-uniform LUT spacing. Because the characteristics of a PA may vary with temperature and may be affected by aging, an adaptive algorithm online updates the LUT value. The spacing adaptor 503 online adapts the LUT spacing. Each LUT entry corresponds to an input amplitude $r_m$ of modulated signal. The adapted LUT spacing balances the IMD power at the PA output corresponding to each bin, so that the total IMD power at the PA output is minimized.

Figure 6:
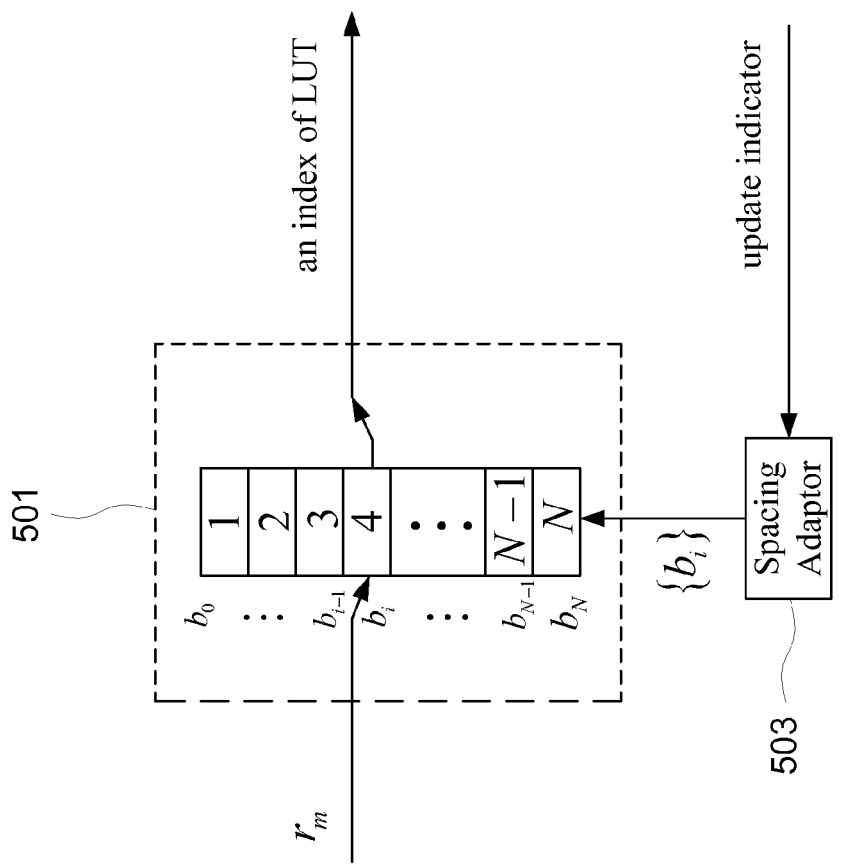
FIG. 6 is a block diagram of the index mapper shown in FIG. 5.

FIG. 6 is a block diagram of the index mapper shown in FIG. 5. As shown in FIG. 6, if the update indicator ω set to be 1, the spacing adaptor 503 is running. When the spacing adaptor 503 provides the index mapper 501 with a new set of bin boundary $\{b_i\}$, the index mapper 501 generates an index of the LUT 505 to indicate a selected entry of LUT 505. While the LUT 505 is indexed by an input amplitude $r_m$ via the index mapper 501 to implement the unconditionally non-uniform LUT spacing. Thereby, each LUT entry corresponds to an input amplitude $r_m$.

In order to make the LUT spacing of the present invention unconditionally-optimized, the present invention expresses the IMD power associated with each LUT entry in terms of variables other than the IBO, the PA characteristics and the PDF of the modulated input signal. In other words, the concerned LUT spacing problem becomes an optimization problem to minimize the total IMD power at the PA output. The followings describe the IMD power derivation according to the present invention to guarantee the existence of the optimum solution under some practical scenarios.

Without loss of generality, the present invention assume that (1) the modulated input signal $v_m$ is real and (2) the PA has only amplitude-modulated amplitude-distortion (AM/AM) nonlinear distortion to proceed with the IMD power derivation. After that, the derivation is extended to a general scenario.

Since the number of the LUT entries is finite, N≠∞, so the transfer function of the PD is only piecewise continuous. The PD transfer function of the $i^{th}$ bin is defined as $F_i(r_{m,i})$, where $r_{m,i} = r_{mo,i} + \delta r_{m,i}$ is an input signal amplitude near the amplitude midpoint $r_{mo,i}$ of the $i^{th}$ bin. With $r_{m,i}$ as the input amplitude of the $i^{th}$ bin, the PA output amplitude error associated with the $i^{th}$ LUT entry is derived as $$e_i = G(F_o(r_{m,i})) - G(F_i(r_{m,i})) \approx F_i' \cdot G'(F_i(r_{mo,i})),$$

where $F_o(r_{mo,i})$ is the ideal PD transfer function of the $i^{th}$ bin, $\delta F_i = r_{m,i} \cdot \delta |f_i| \approx r_{mo,i} \cdot |f_o(r_{mo,i})|' \cdot \delta r_{m,i}$ is the LUT approximation error of the PD output amplitude, $\delta |f_i|$ is the PD gain error of the $i^{th}$ LUT entry value, $f_o(r_{mo,i})$ is defined as the LUT value of $r_{mo,i}$ in the $i^{th}$ bin, $|f_o(r_{mo,i})|'$ is the derivative of $|f_o(r_{mo,i})|$ with respect to $r_{m,i}$, and $G'(F_i(r_{mo,i}))$ is the slope of the tangent to the G curve, where the G curve is the transfer function of a PA. Note that we have $$G'(F_i(r_{mo,i})) = \frac{d}{dF_i(r_{m,i})} G(F_i(r_{m,i})) \Big|_{F_i(r_{m,i}) = F_i(r_{mo,i})}$$

$$= \left( \frac{d}{dr_{m,i}} F_i(r_{m,i}) \Big|_{r_{m,i} = r_{mo,i}} \right)^{-1},$$

where $$F_i'(r_{mo,i}) = \frac{d}{dr_{m,i}} F_i(r_{m,i}) \Big|_{r_{m,i} = r_{mo,i}}$$

$$= |f_o(r_{mo,i})| + r_{mo,i} \cdot \frac{\text{Re}(f_o^*(r_{mo,i}) \cdot f_o'(r_{mo,i}))}{|f_o(r_{mo,i})|},$$

$f_o'(r_{mo,i})$ is the derivative of $f_o(r_{mo,i})$ with respect to $r_{m,i}$, $(\cdot)^*$ is the complex conjugate operation, and $\text{Re}(\cdot)$ denotes the real part of the enclosed argument.

For a small bin, it is reasonable to expect that $\delta r_{m,i}$ is uniformly distributed over the entire bin width. The IMD power associated with the $i^{th}$ LUT entry governing a bin of width $d_i$ can further be expressed as $$\frac{1}{d_i} \int_{-d_i/2}^{d_i/2} |e_i|^2 d(\delta r_{m,i}) = \left( \frac{r_{mo,i} \cdot |f_o(r_{mo,i})|'}{F_i'(r_{mo,i})} \right)^2 \cdot \frac{d_i^2}{12}.$$

To generalize the derivation above, the present invention now considers the amplitude-modulated phase-distortion (AM/PM) effect of the PA having a complex modulated input signal $v_m$. With a similar derivation, the phase error associated with the $i^{th}$ LUT entry at the PA output is expressed as $$e_{\phi,i} \approx \left( \frac{d}{dr_{m,i}} \arg(f_o(r_{m,i})) \Big|_{r_{m,i} = r_{mo,i}} \right) \cdot \delta r_{m,i} - r_{mo,i} \cdot |f_o(r_{m,i})|' \cdot$$

$$\delta r_{m,i} \cdot \left( \frac{d}{dr_{m,i}} \arg(f_o(r_{m,i})) \Big|_{r_{m,i} = r_{mo,i}} \right)$$

$$= [\arg(f_0(r_{mo,i}))]' \cdot (1 - r_{mo,i} \cdot |f_o(r_{mo,i})|') \cdot \delta r_{m,i},$$

where $|f_o(r_{mo,i})|$ and $\arg(f_o(r_{mo,i}))$ respectively denote the amplitude and the phase of $f_o(r_{mo,i})$, and $|f_o(r_{mo,i})|'$ and $[\arg(f_o(r_{mo,i}))]'$ respectively denote the derivative of $|f_o(r_{mo,i})|$ and $\arg(f_o(r_{mo,i}))$ with respect to $r_{m,i}$.

Since the amplitude error $e_i$ and the phase error $e_{\phi,i}$ are orthogonal in the polar coordinate, the IMD power associated with the $i^{th}$ LUT entry can thus be extended to $\frac{1}{d_i} \int_{-d_i/2}^{d_i/2} (|e_i|^2 + r_{mo,i}^2 \cdot |e_{\phi,i}|^2) d(\delta r_{m,i}).$ The concerned LUT spacing problem becomes an optimization problem to minimize the total IMD power at the PA output as $$\{\beta_i\} = \underset{\{d_i\}}{\arg\min} P_{ae} = \underset{\{d_i\}}{\arg\min} \sum_{i=1}^{N} \eta_i \cdot d_i^2,$$

where $$\eta_i = \left[ \left( \frac{|f_o(r_{mo,i})|'}{F_i'(r_{mo,i})} \right)^2 + \left( \left| \frac{[\arg(f_o(r_{mo,i}))]' \cdot}{(1 - r_{mo,i} \cdot |f_o(r_{mo,i})|')} \right| \right)^2 \right] \cdot r_{mo,i}^2 \cdot \frac{p_i}{12},$$

and $p_i$ is the probability mass function (PMF) of $r_m$ in the $i^{th}$ bin.

Next, the present invention describes an iterative procedure to approach a stationary solution which is likely to be the optimum solution. After that, the present invention further adaptively updates the index mapper through the iterative procedure.

Figure 7:
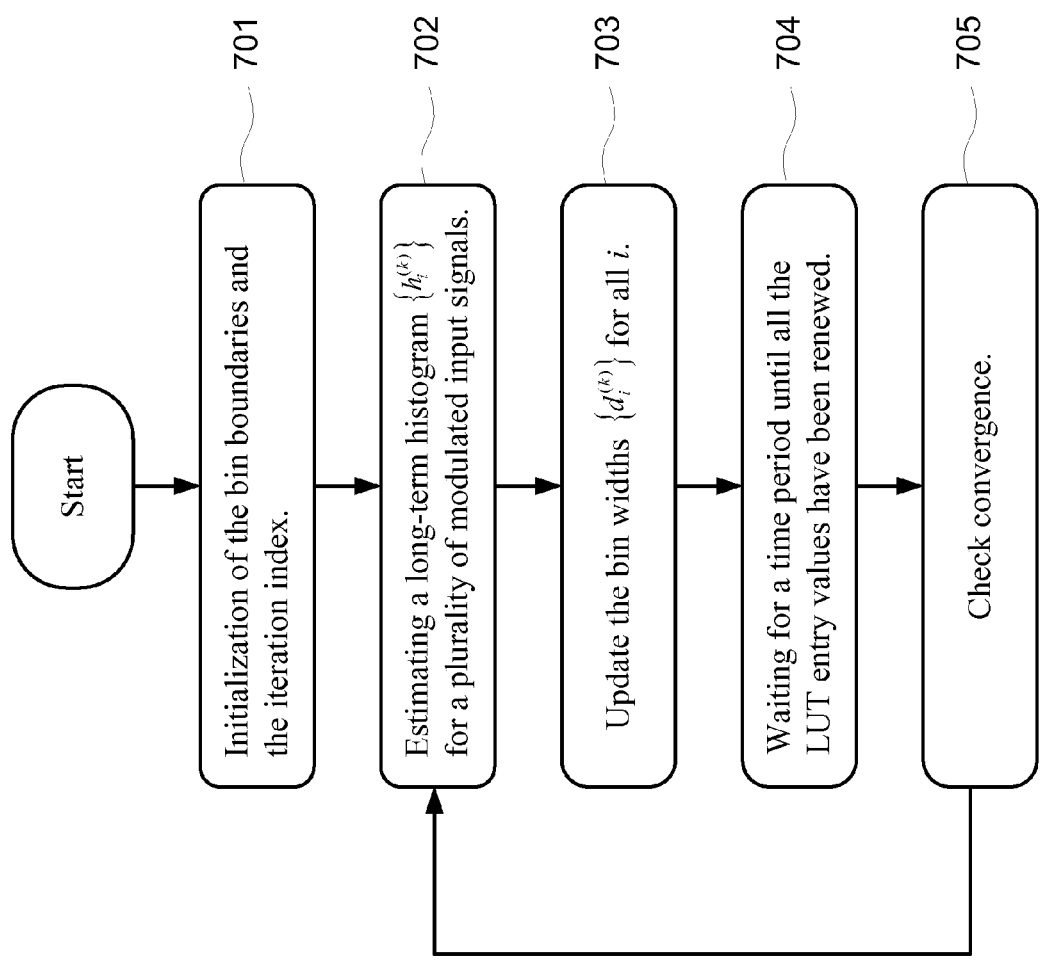
FIG. 7 is a flowchart illustrating the iterative procedure.

FIG. 7 is a flowchart illustrating the iterative procedure. Referring to FIG. 7, the iterative procedure starts with the initialization of the bin boundaries and the iteration index, it then assigns the midpoint of each bin, as illustrated in step 701. In step 702, a long-term histogram for a plurality of modulated input signals is estimated. First, the modulated input signals are processed for a current iteration k, and a short-term histogram $\{\tilde{h}_i^{(k)}\}$ is summarized. A long-term histogram $\{h_i^{(k)}\}$ is then approximated through the mean of the short-term histogram. However the present invention further replaces the PMF $\{p_i\}$ by a long-term histogram $\{h_i\}$, the optimization problem becomes truly unconditional. According to the stationary solution, the bin width $\{d_i\}$, for all i, are updated, as shown in step 703. After the LUT spacing is updated, the current iteration waits for a time period until all the LUT entry values have been renewed, as shown in step 704. If all the LUT entry values have been renewed, the update indicator is set to be 1. Otherwise the update indicator is set to be 0. The update indicator ω points out the LUT entry values are or are not updated. The renewed values are used for the next iteration. Finally, a step of check convergence with a convergence indicator ρ is taken, as in step 705. If the LUT spacing difference $$\sum_{i=1}^{N} |d_i^{(k)} - d_i^{(k-1)}|$$

between the current iteration and the previous iteration is smaller than a predetermined threshold $\epsilon$., then the convergence indicator is set to be 1; otherwise the convergence indicator is set to be 0. The convergence indicator ρ serves as a quality indicator of the DAPD-LUT technique.

Therefore, in order to prepare for the next iteration, the followings must be done, i e. updating the bin boundaries by $$b_i^{(k+1)} = b_{i-1}^{(k+1)} + d_i^{(k)},$$

reassigning the bin midpoints by $$r_{mo,i}^{(k)} = \frac{1}{2}(b_i^{(k)} + b_{i-1}^{(k)}),$$

increasing the iteration index by 1, and going back to step 702. Please be noted that, even when the convergence indicator ρ equals to 1, the iteration of the procedure will continue so as to online adapt the LUT spacing to the variations of all kinds of system conditions.

According to the present invention, in the step 701, the initial values of the bin boundaries $\{b_i^{(k)}\}$ may be set as $$b_0^{(1)} = 0 \text{ and } b_i^{(1)} = \frac{i}{N},$$

where i is the bin index and the superscript $(\cdot)^{(k)}$ denotes the iteration index. After the iteration index k is set to 1, the midpoint of each bin is assigned as $$r_{mo,i}^{(k)} = \frac{1}{2}\left(b_i^{(k)} + b_{i-1}^{(k)}\right).$$

In the step 702, the long-term histogram is estimated by $h_i^{(k)} = \lambda \cdot h_i^{(k-1)} + (1-\lambda) \cdot \hat{h}_i^{(k)}$, where the short-term histogram $\{\hat{h}_i^{(k)}\}$ is averaged, λ is a forgetting factor, 0<λ≦1, and $$h_i^{(0)} = \frac{1}{N}.$$

In the step 703, the bin widths $\{d_i\}$ for $k^{th}$ iteration is updated by $$d_i^{(k)} = \frac{\xi^{(k)}}{\eta_i^{(k)}},$$

where $$\eta_i^{(k)} = \left[\left(\frac{|f_o(r_{mo,i})|'}{F_i'(r_{mo,i})}\right)^2 + \left(\left|\frac{[\arg(f_o(r_{mo,i}))]' \cdot}{(1 - r_{mo,i} \cdot |f_o(r_{mo,i})|')}\right|\right)^2\right] \cdot r_{mo,i}^2 \cdot \frac{h_i^{(k)}}{12},$$

$$\xi^{(k)} = \left(\sum_{i=1}^{N}\left(\eta_i^{(k)}\right)^{-1}\right)^{-1}$$

is a normalization constant, $f_o(r_{mo,i})$ denotes the LUT value of $r_{mo,i}$ in the $i^{th}$ bin, $F_i(r_{mo,i})$ denotes the PD transfer function of the $i^{th}$ bin, $F'_i(r_{mo,i})$ denotes the derivative of $F_i(r_{mo,i})$ with respect to $r_{m,i}$, $|f_o(r_{mo,i})|$ and $\arg(f_o(r_{mo,i}))$ respectively denote the amplitude and the phase of $f_o(r_{mo,i})$, and $|f_o(r_{mo,i})|'$ and $[\arg(f_o(r_{mo,i}))]'$ respectively denote the derivative of $|f_o(r_{mo,i})|$ and $\arg(f_o(r_{mo,i}))$ with respect to $r_{m,i}$.

Figure 8:
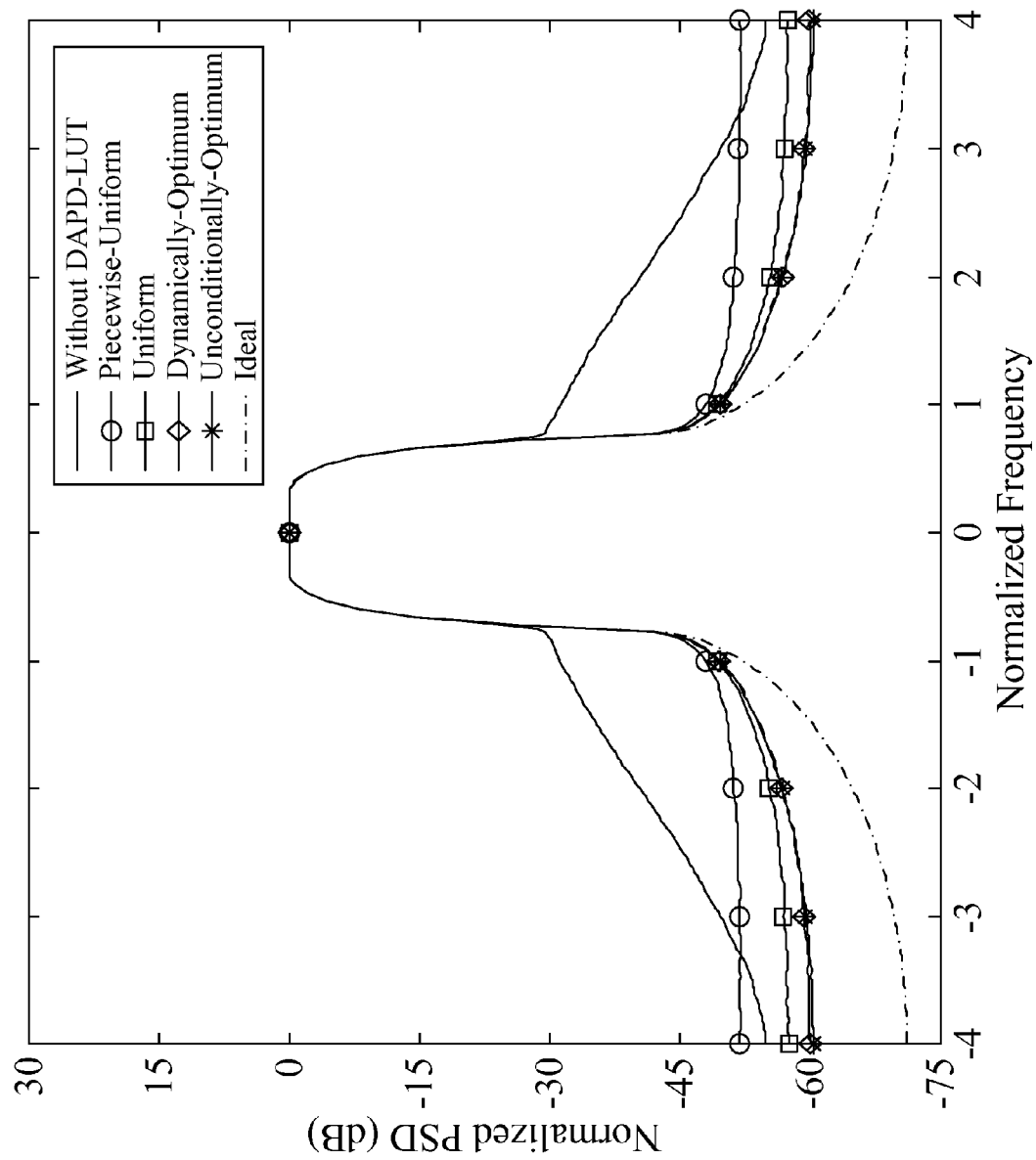
FIG. 8 shows the power spectral density performance comparison among several DAPD-LUT techniques with various LUT spacings in the system scenario with IBO=−10 dB.

FIG. 8 shows the power spectral density (PSD) performance comparison among several DAPD-LUT techniques with various LUT spacings in the system scenario with IBO=−10 dB, wherein the PSD performance is in terms of the normalized PSD of the PA output signal. As shown in FIG. 8, the dynamically-optimum of the present invention outperforms the other techniques with large gaps and approaches the unconditionally-optimum technique with a small gap.

Two simulation experiments are further conducted to evaluate the present invention. The first experiment tests its feasibility and compares the IMD performance among several conventional DAPD-LUT techniques with various LUT spacings. The second experiment tests the robustness of the present invention in a time-varying wireless system.

Figure 9:
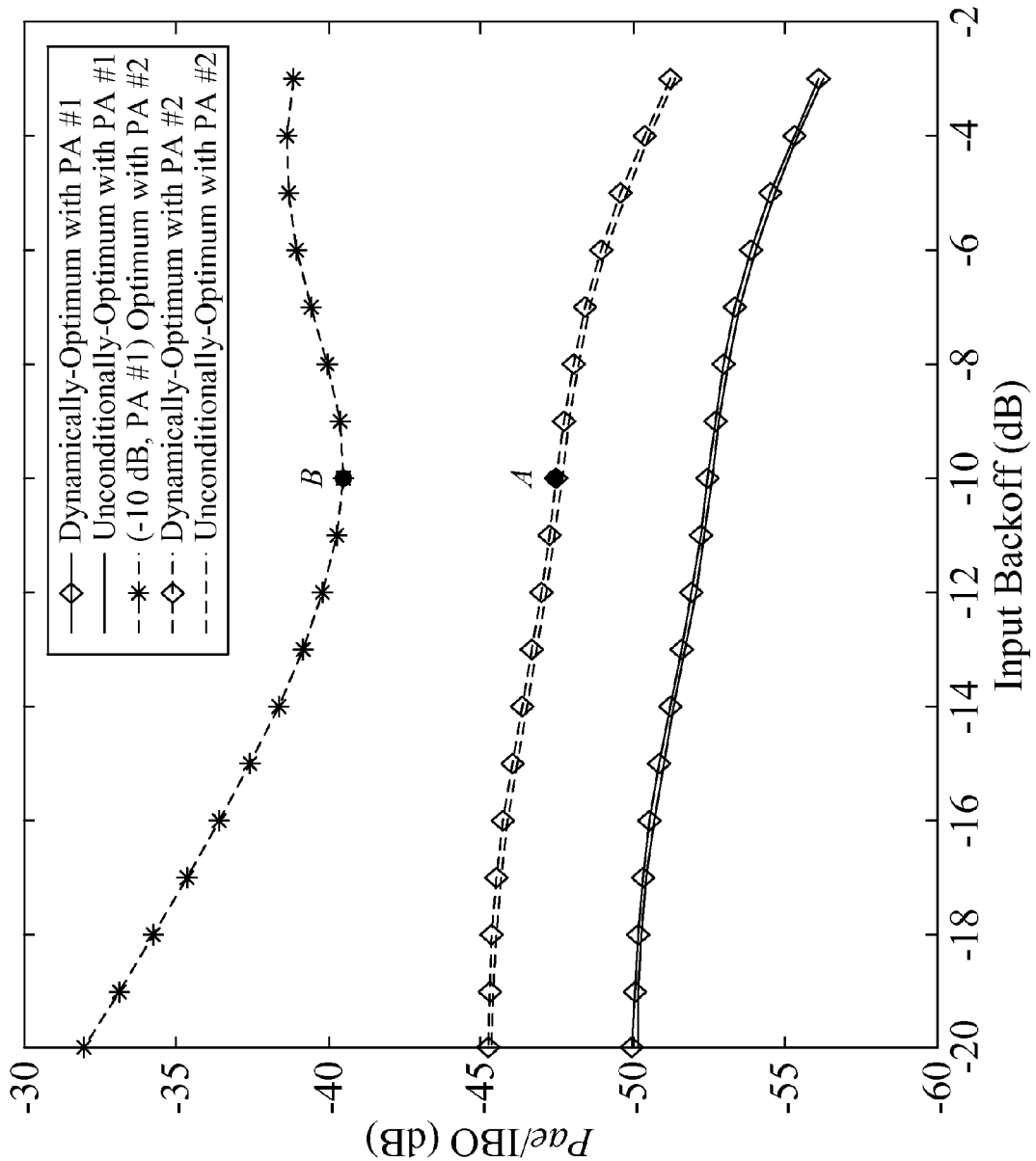
FIG. 9 shows the normalized IMD power of several DAPD-LUT techniques with various LUT spacings in system scenarios with varying IBOs and different PAs.

In the first experiment, two conditions of the IBO and the PA characteristics conditions in the system scenario are relaxed. The normalized IMD powers of several DAPD-LUT techniques with various LUT spacings are shown in FIG. 9. The two solid curves denote the IMD performance in the system scenario with PA #1. The three dashed curves denote the IMD performance in the system scenario with PA #2. Since the nonlinearity of PA #2 is worse than that of PA #1, the unconditionally-optimum scheme in the system scenario with PA #2 performs worse than that with PA #1. Nevertheless, the performance of the dynamically-optimum technique of the present invention still approaches that of the unconditionally-optimum technique regardless of the PA characteristics.

On the other hand, if the conditionally-optimum technique is optimized for IBO=−10 dB and PA #1 in system scenarios with varying IBOs and with PA #2, as shown as the "(−10 dB, PA #1) Optimum with PA #2" curve in FIG. 9, the performance degradation is significant. Comparing point A and point B in FIG. 9, it can be observed that there is a 6-dB performance degradation of the conditionally-optimum technique with only the mismatch of the PA characteristics.

Figure 10:
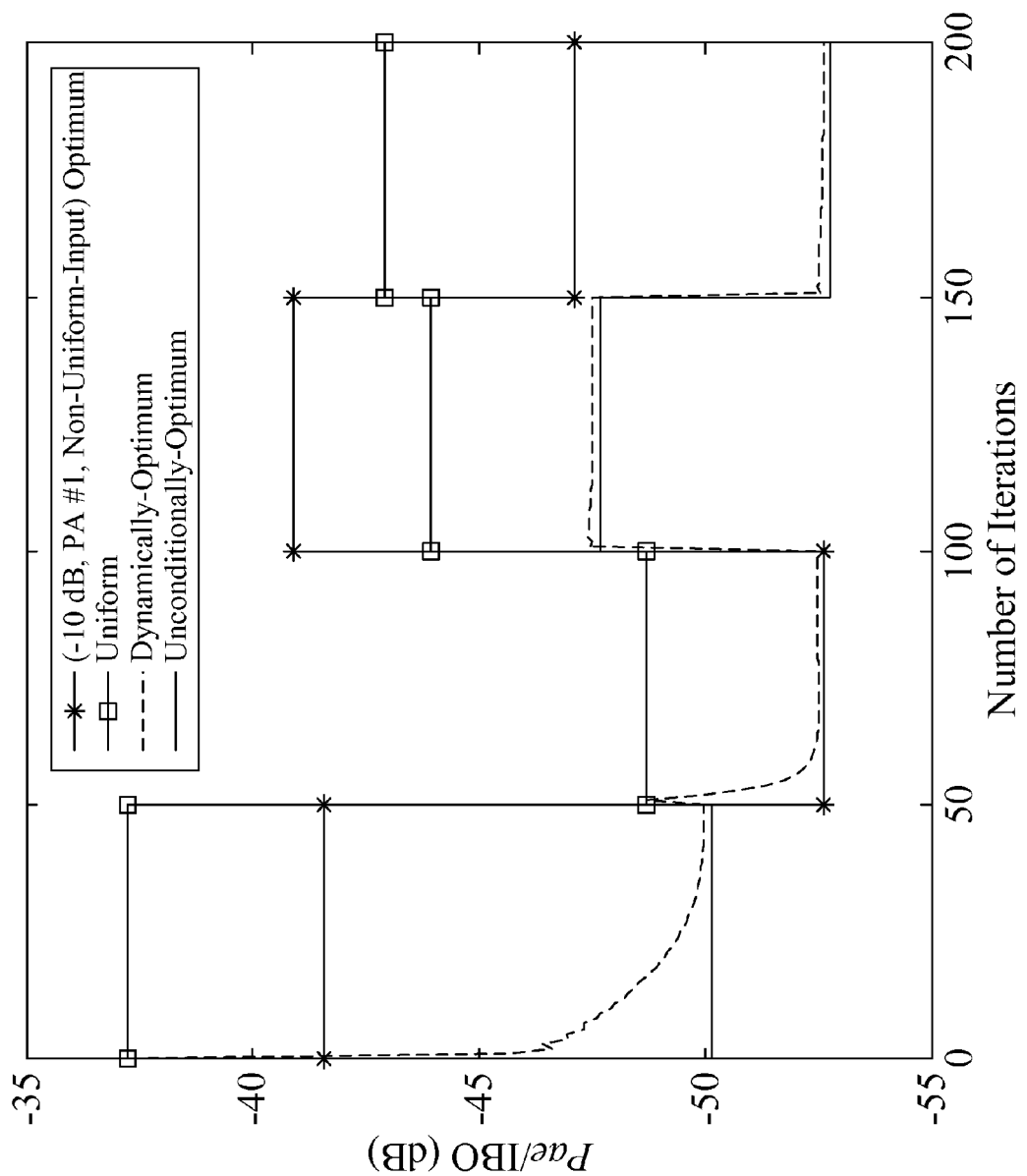
FIG. 10 shows the normalized IMD power at the PA output of several DAPD-LUT techniques with various LUT spacings.

In the second experiment, the robustness of the dynamically-optimum technique of the present invention in a highly volatile system scenario is tested. The learning curve of the dynamically-optimum technique of the present invention is shown in FIG. 10 in a time-varying system scenario with (1) IBO=−20 dB, PA #1, and the non-uniform OFDM input at the beginning, (2) the IBO jumping from −20 dB to −10 dB at the $50^{th}$ iteration, (3) PA #1 being replaced by PA #2 at the $100^{th}$ iteration, and (4) the non-uniform OFDM input being replaced by the uniform input at the $150^{th}$ iteration. The horizontal axis represents the number of iteration of the iterative procedure as stated above. The vertical axis represents the normalized IMD power at the PA output.

As can be seen from FIG. 10, only the dynamically-optimum technique of the present invention can adapt itself to the variations of the system conditions. In other words, the performance of the dynamically-optimum technique of the present invention ties itself to the performance of the unconditionally-optimum technique with some transitional performance adaptation, while the performance of all the other DAPD-LUT techniques fluctuates dramatically.

In summary, the present invention provides a dynamically optimized non-uniform LUT spacing for the DAPD-LUT technique to linearize a PA, which has the advantages of being adaptive to all kinds of signal source going through all kinds of PA, being adaptive to time-variation of the wireless environments, low computational complexity, and reaching unconditionally-optimum performance.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An apparatus of dynamically adapting a look up table (LUT) spacing for linearizing a power amplifier (PA), in order to produce an amplified output signal in response to a predistorted input derived from an input modulated signal $v_m$, said apparatus comprising:

a size-N LUT containing N entries, which divides a whole unsaturated PA input amplitude range into N bins, each of said LUT entries corresponding to an input amplitude predistorted by the entries of said LUT, N being a positive integer;

an index mapper, via which said LUT is indexed by an input amplitude $r_m$ of said input modulated signal to implement an unconditionally non-uniform LUT spacing; and a spacing adaptor, which online adapts said LUT spacing, said adapted LUT spacing balancing inter-modulation distortion (IMD) power at a PA output corresponding to each bin so that total IMD power at said PA output is minimized;

wherein said spacing adaptor adapts said LUT spacing based on a histogram-based predistortion method derived from processing histograms of a plurality of input modulated signals using an online iterative procedure including the steps of:

initializing bin boundaries of said LUT and an iteration index k, and assigning a midpoint of each said bin;

estimating a long-term histogram for said plurality of input modulated signals;

updating N bin widths $\{d_i\}$, for i from 1 to N;

waiting until all entry values in said LUT have been renewed; and checking if a difference of said LUT spacing between a current iteration and a previous iteration is convergent.

2. The apparatus of dynamically adapting an LUT spacing for linearizing a PA as claimed in claim 1, wherein said spacing adaptor provides said index mapper with a new set of bin boundary $\{b_i\}$ for i=0, . . . , N, and said index mapper generates an index of said LUT to indicate a selected entry of said LUT.

3. The apparatus of dynamically adapting an LUT spacing for linearizing a PA as claimed in claim 2, wherein each said LUT entries corresponds to one said input amplitude $r_m$ of said input modulated signal via said index mapper.

4. A method of dynamically adapting a look up table (LUT) spacing for linearizing a power amplifier (PA), in order to produce an amplified output signal in response to a predistorted input derived from an input modulated signal $v_m$, said method comprising the steps of:

dividing a whole unsaturated PA input amplitude range into N bins, each predistorted by an entry of a size-N LUT, N being a positive integer;

indexing said size-N LUT by an input amplitude $r_m$ to implement an unconditionally non-uniform LUT spacing; and online adapting said LUT spacing, said adapted LUT spacing balancing inter-modulation distortion (IMD) power at a PA output corresponding to each bin so that total IMD power at said PA output is minimized;

wherein said online adapting said LUT spacing is based on a histogram-based predistortion method derived from processing histograms of a plurality of input modulated signals using an iterative procedure including the steps of:

initializing bin boundaries of said LUT and an iteration index k, and assigning a midpoint of each said bin;

estimating a long-term histogram for said plurality of input modulated signals;

updating N bin widths $\{d_i\}$, for i from 1 to N;

waiting until all entry values in said LUT have been renewed; and checking if a difference of said LUT spacing between a current iteration and a previous iteration is convergent.

5. The method of dynamically adapting an LUT spacing for linearizing a PA as claimed in claim 4, wherein preparing a next iteration in said iterative procedure includes the steps of updating the bin boundaries by $$b_i^{(k+1)} = b_{i-1}^{(k+1)} + d_i^{(k)},$$

reassigning the bin midpoints by $$r_{mo,i}^{(k)} = \frac{1}{2}\left(b_i^{(k)} + b_{i-1}^{(k)}\right),$$

increasing the iteration index k by 1, and going back to obtain said long-term histogram.

6. The method of dynamically adapting an LUT spacing for linearizing a PA as claimed in claim 4, wherein convergence is checked with an indicator ρ, and said indicator ρ serves as a quality indicator of a digital predistorter with said LUT spacing for linearizing said PA.

7. The method of dynamically adapting an LUT spacing for linearizing a PA as claimed in claim 4, wherein said long-term histogram is estimated through the steps of processing said plurality of input modulated signals for said current iteration, and estimating said long-term histogram through the mean of a summarized short-term histogram.

8. The method of dynamically adapting an LUT spacing for linearizing a PA as claimed in claim 4, wherein said bin widths $\{d_i\}$ for $k^{th}$ iteration is updated by $$d_i^{(k)} = \frac{\xi^{(k)}}{\eta_i^{(k)}},$$

where $$\eta_i^{(k)} = \left[\left(\frac{|f_o(r_{mo,i})|'}{F_i'(r_{mo,i})}\right)^2 + \left(\left|\frac{[\arg(f_o(r_{mo,i}))]' \cdot}{(1 - r_{mo,i} \cdot |f_o(r_{mo,i})|')}\right|\right)^2\right] \cdot r_{mo,i}^2 \cdot \frac{h_i^{(k)}}{12},$$

$$\xi^{(k)} = \left(\sum_{i=1}^{N} \left(\eta_i^{(k)}\right)^{-1}\right)^{-1}$$

is a normalization constant, $h_i^{(k)}$ denotes a long-term histogram of the probability mass function (PMF) of $r_{m,i}$ in the $i^{th}$ bin, $f_o(r_{mo,i})$ denotes the LUT value of $r_{mo,i}$ in the $i^{th}$ bin, $F_i(r_{mo,i})$ denotes predistorer (PD) transfer function of the $i^{th}$ bin, $F_i'(r_{mo,i})$ denotes the derivative of $F_i(r_{mo,i})$ with respect to $r_{m,i}$, $|f_o(r_{mo,i})|$ and $\arg(f_o(r_{mo,i}))$ respectively denote the amplitude and the phase of $f_o(r_{mo,i})$, $|f_o(r_{mo,i})|'$ and $[\arg(f_o(r_{mo,i}))]'$ respectively denote the derivative of $|f_o(r_{mo,i})|$ and $\arg(f_o(r_{mo,i}))$ with respect to $r_{m,i}$.

9. The method of dynamically adapting an LUT spacing for linearizing a PA as claimed in claim 4, wherein said LUT spacing derives variables $\{\eta_i\}$, for i from 1 to N, to minimize said total IMD power at the PA output, and said variables $\{\eta_i\}$ is denoted as $$\eta_i = \left[\left(\frac{|f_o(r_{mo,i})|'}{F_i'(r_{mo,i})}\right)^2 + \left(\left|\frac{[\arg(f_o(r_{mo,i}))]' \cdot}{(1 - r_{mo,i} \cdot |f_o(r_{mo,i})|')}\right|\right)^2\right] \cdot r_{mo,i}^2 \cdot \frac{p_i}{12},$$

where $p_i$ is the probability mass function (PMF) of the amplitude $r_m$ of said input modulated signal $v_m$ in the $i^{th}$ bin, $f_o(r_{mo,i})$ denotes the LUT value of $r_{mo,i}$ in the $i^{th}$ bin, $F_i(r_{mo,i})$ denotes predistorter (PD) transfer function of the $i^{th}$ bin, $F_i'(r_{mo,i})$ denotes the derivative of $F_i(r_{mo,i})$ with respect to $r_{m,i}$, $|f_o(r_{mo,i})|$ and $\arg(f_o(r_{mo,i}))$ respectively denote the amplitude and the phase of $f_o(r_{mo,i})$, and $|f_o(r_{mo,i})|'$ and $[\arg(f_o(r_{mo,i}))]'$ respectively denote the derivative of $|f_o(r_{mo,i})|$ and $\arg(f_o(r_{mo,i}))$ with respect to $r_{m,i}$.

10. The method of dynamically adapting an LUT spacing for linearizing a PA as claimed in claim 4, wherein said long-term histogram for $k^{th}$ iteration is estimated by $$h_i^{(k)} = \lambda \cdot h_i^{(k-1)} + (1-\lambda) \cdot \hat{h}_i^{(k)},$$

where a short-term histogram $\{\hat{h}_i^{(k)}\}$, for i from 1 to N, is averaged, $\lambda$ is a forgetting factor, $$0 < \lambda \leq 1, \text{ and } h_i^{(0)} = \frac{1}{N}.$$

11. A method of dynamically adapting a look up table (LUT) spacing for linearizing a power amplifier (PA), in order to produce an amplified output signal in response to a predistorted input derived from an input modulated signal $v_m$, said method comprising the steps of:

indexing said LUT containing a plurality of entries by an input amplitude; and dynamically adapting said LUT spacing, and generating said adapted LUT spacing for which total inter-modulation distortion (IMD) power at said PA output is minimized;

wherein said LUT divides a whole unsaturated PA input amplitude range into a plurality of bins, each predistorted by an entry of said LUT, and said total IMD power associated with each LUT entry is expressed in terms of variables other than backoff of said input modulated signal, PA characteristics and probability density function (PDF) of said input modulated signal, and said spacing adaptor adapts said LUT spacing based on a histogram-based predistortion method derived from processing histograms of a plurality of input modulated signals;

wherein said dynamically adapting said LUT spacing is achieved through an iterative procedure including the steps of:

initializing bin boundaries of said LUT and an iteration index k, and assigning a midpoint of each said bin;

estimating a long-term histogram for said plurality of input modulated signals;

updating a bin width to each said bin;

waiting until all entry values in said LUT have been renewed; and checking convergence for said updated bin width to each said bin.

12. The method of dynamically adapting an LUT spacing for linearizing a PA as claimed in claim 11, wherein preparing a next iteration in said iterative procedure includes the steps of updating the bin boundaries by $$b_i^{(k+1)} = b_{i-1}^{(k+1)} + d_i^{(k)},$$

reassigning the bin midpoints by $$r_{mo,i}^{(k)} = \frac{1}{2}(b_i^{(k)} + b_{i-1}^{(k)}),$$

increasing said iteration index k by 1, and going back to obtain said long-term histogram.

13. The method of dynamically adapting an LUT spacing for linearizing a PA as claimed in claim 11, wherein said long-term histogram is estimated through the steps of processing said plurality of input modulated signals for a current iteration, and estimating said long-term histogram through the mean of a summarized short-term histogram.

14. The method of dynamically adapting an LUT spacing for linearizing a PA as claimed in claim 11, wherein said LUT spacing derives variables $\{\eta_i\}$, for each bin i, to minimize said total IMD power at the PA output, and said variables $\{\eta_i\}$ is denoted as $$\eta_i = \left[\left(\frac{|f_o(r_{mo,i})|'}{F_i'(r_{mo,i})}\right)^2 + \left(\left|\frac{[\arg(f_o(r_{mo,i}))]' \cdot}{(1-r_{mo,i} \cdot |f_o(r_{mo,i})|')}\right|\right)^2\right] \cdot r_{mo,i}^2 \cdot \frac{p_i}{12},$$

where $p_i$ is the probability mass function (PMF) of the amplitude $r_m$ of said modulated signal $v_m$ in the $i^{th}$ bin, $f_o(r_{mo,i})$ denotes the LUT value of $r_{mo,i}$ in the $i^{th}$ bin, $F_i(r_{mo,i})$ denotes predistorter (PD) transfer function of the $i^{th}$ bin, $F_i'(r_{mo,i})$ denotes the derivative of $F_i(r_{mo,i})$ with respect to $r_{m,i}$, $|f_o(r_{mo,i})|$ and $\arg(f_o(r_{mo,i}))$ respectively denote the amplitude and the phase of $f_o(r_{mo,i})$, and $|f_o(r_{mo,i})|'$ and $[\arg(f_o(r_{mo,i}))]'$ respectively denote the derivative of $|f_o(r_{mo,i})|$ and $\arg(f_o(r_{mo,i}))$ with respect to $r_{m,i}$.

15. The method of dynamically adapting an LUT spacing for linearizing a PA as claimed in claim 11, wherein the bin width to each $i^{th}$ bin for $k^{th}$ iteration is updated by $$d_i^{(k)} = \frac{\xi^{(k)}}{\eta_i^{(k)}},$$

where $$\eta_i^{(k)} = \left[\left(\frac{|f_o(r_{mo,i})|'}{F_i'(r_{mo,i})}\right)^2 + \left(\left|\frac{[\arg(f_o(r_{mo,i}))]' \cdot}{(1-r_{mo,i} \cdot |f_o(r_{mo,i})|')}\right|\right)^2\right] \cdot r_{mo,i}^2 \cdot \frac{h_i^{(k)}}{12},$$

$$\xi^{(k)} = \left(\sum_{i=1}^{N} (\eta_i^{(k)})^{-1}\right)^{-1}$$

is a normalization constant, $h_i^{(k)}$ denotes a long-term histogram of the probability mass function (PMF) of $r_{m,i}$ in the $i^{th}$ bin, $f_o(r_{mo,i})$ denotes the LUT value of $r_{mo,i}$ in the $i^{th}$ bin, $F_i(r_{mo,i})$ denotes predistorter (PD) transfer function of the $i^{th}$ bin, $F_i'(r_{mo,i})$ denotes the derivative of $F_i(r_{mo,i})$ with respect to $r_{m,i}$, $|f_o(r_{mo,i})|$ and $\arg(f_o(r_{mo,i}))$ respectively denote the amplitude and the phase of $f_o(r_{mo,i})$, and $|f_o(r_{mo,i})|'$ and $[\arg(f_o(r_{mo,i}))]'$ respectively denote the derivative of $|f_o(r_{mo,i})|$ and $\arg(f_o(r_{mo,i}))$ with respect to $r_{m,i}$.

* * * * *